United States Patent [19]
DelPrete et al.

[11] Patent Number: 5,215,472
[45] Date of Patent: Jun. 1, 1993

[54] HIGH DENSITY GRID ARRAY SOCKET

[75] Inventors: Stephen D. DelPrete; Don Santos, both of Rehoboth, Mass.; Steven R. Corbesero, Johnston, R.I.

[73] Assignee: Augat Inc., Mansfield, Mass.

[21] Appl. No.: 748,505

[22] Filed: Aug. 22, 1991

[51] Int. Cl.$^5$ .............................................. H01R 13/62
[52] U.S. Cl. .................................. 439/71; 439/66; 439/331; 439/923; 206/328
[58] Field of Search ............................. 439/66, 68–73, 439/330, 331, 923; 206/328, 329, 331, 334

[56] References Cited

U.S. PATENT DOCUMENTS

| Re. 32,370 | 3/1987 | Bright et al. | 439/331 |
|---|---|---|---|
| 4,220,383 | 9/1980 | Scheingold et al. | 439/71 |
| 4,354,720 | 10/1982 | Bakermans | 439/357 |
| 4,511,196 | 4/1985 | Schuler et al. | 29/842 |
| 4,513,353 | 4/1985 | Bakermans et al. | 439/71 |
| 4,636,026 | 1/1987 | Cooney et al. | 339/255 R |
| 4,838,801 | 6/1989 | Bertoglio et al. | 439/83 |
| 4,906,194 | 3/1990 | Grabbe | 439/71 |
| 4,918,513 | 4/1990 | Kurose et al. | 439/71 |
| 4,929,194 | 5/1990 | Korsunsky et al. | 439/571 |
| 4,961,709 | 10/1990 | Noschese | 439/66 |
| 5,066,245 | 11/1991 | Walker | 206/331 |
| 5,073,116 | 12/1991 | Beck, Jr. | 439/331 |
| 5,127,837 | 7/1992 | Shah et al. | 439/71 |

*Primary Examiner*—Neil Abrams
*Attorney, Agent, or Firm*—Weingarten, Schurgin, Gagnebin & Hayes

[57] ABSTRACT

A leadless component socket comprises a one- or two-piece leadless component contact socket assembly having a plurality of holes with a respective plurality of spring contacts disposed therein. The socket assembly includes a finger slot or slots to facilitate the manual removal of a chip carrier from the socket and a bias clip and integral keyed corner for assuring proper alignment of the chip carrier with the contacts of the socket assembly. The socket further comprises a cover, a cover support, an insulator assembly and a backup plate or other fastening means for supporting the socket on a printed circuit board. The socket assembly can be configured with a variety of contact terminal ends adapted for a desired mode of circuit board interface. A variety of cover configurations are also accommodated and disclosed.

44 Claims, 11 Drawing Sheets

HIGH DENSITY GRID ARRAY SOCKET

FIELD OF THE INVENTION

The present invention relates to electronic component sockets, and in particular to a high density land grid array socket.

BACKGROUND OF THE INVENTION

Leadless chip carrier sockets are known, for removably socketing leadless chip carriers or packages which have no protruding electrical leads but which have contact sites or pads to which electrical contact must be made. However, such known leadless chip carrier sockets are not satisfactory in terms of contact reliability, especially where sophisticated packaging results in increasing pin densities and consequently in greater numbers of contacts.

Former technology used plated through-holes or surface mounted IC chips soldered directly to the board. With today's density of chip carriers, these techniques are not easy to achieve. If an IC chip becomes defective, replacing a soldered chip becomes more difficult than using a socket.

Plastic IC chip carriers with high pin count have relatively small leads that are more difficult to solder to a printed circuit board. Extra cost is added to protect IC chip carriers during handling and transportation.

Today's high numbers of closely spaced contacts make it important to protect the leads of the IC chip carrier to maintain their proper position. Damage or misalignment of the chip carrier leads can cause an unreliable electrical connection. With higher speeds of systems, the chip carriers require shorter lead lengths to reduce capacitance and inductance. Current package styles may have no leads.

Prior art using ceramic chip carriers with leads bonded to pads has undesirable built-in capacitance and self-inductance.

SUMMARY OF THE INVENTION

The present invention is a high density land grid array socket which can be assembled in various configurations. The socket 10 generally comprises a leadless component contact socket assembly, a cover, a cover support, insulator assembly and a backup plate. The contact socket assembly can be assembled with a variety of contact terminal end configurations and adapted for a desired mode of circuit board interface. A variety of cover configurations are also accommodated and disclosed.

Features of the socket according to the invention include a leadless component contact socket assembly comprising a finger slot or slots for facilitating the manual removal of a chip carrier from the socket. A bias clip and socket integral keyed corner are incorporated for assuring proper alignment of the chip carrier with the contact socket assembly.

DESCRIPTION OF THE DRAWING

These and other features and advantages of the present invention will become apparent in light of the following detailed description of an illustrative embodiment thereof, as illustrated in the accompanying drawing of which.

DETAILED DESCRIPTION OF THE INVENTION

Figure 1:
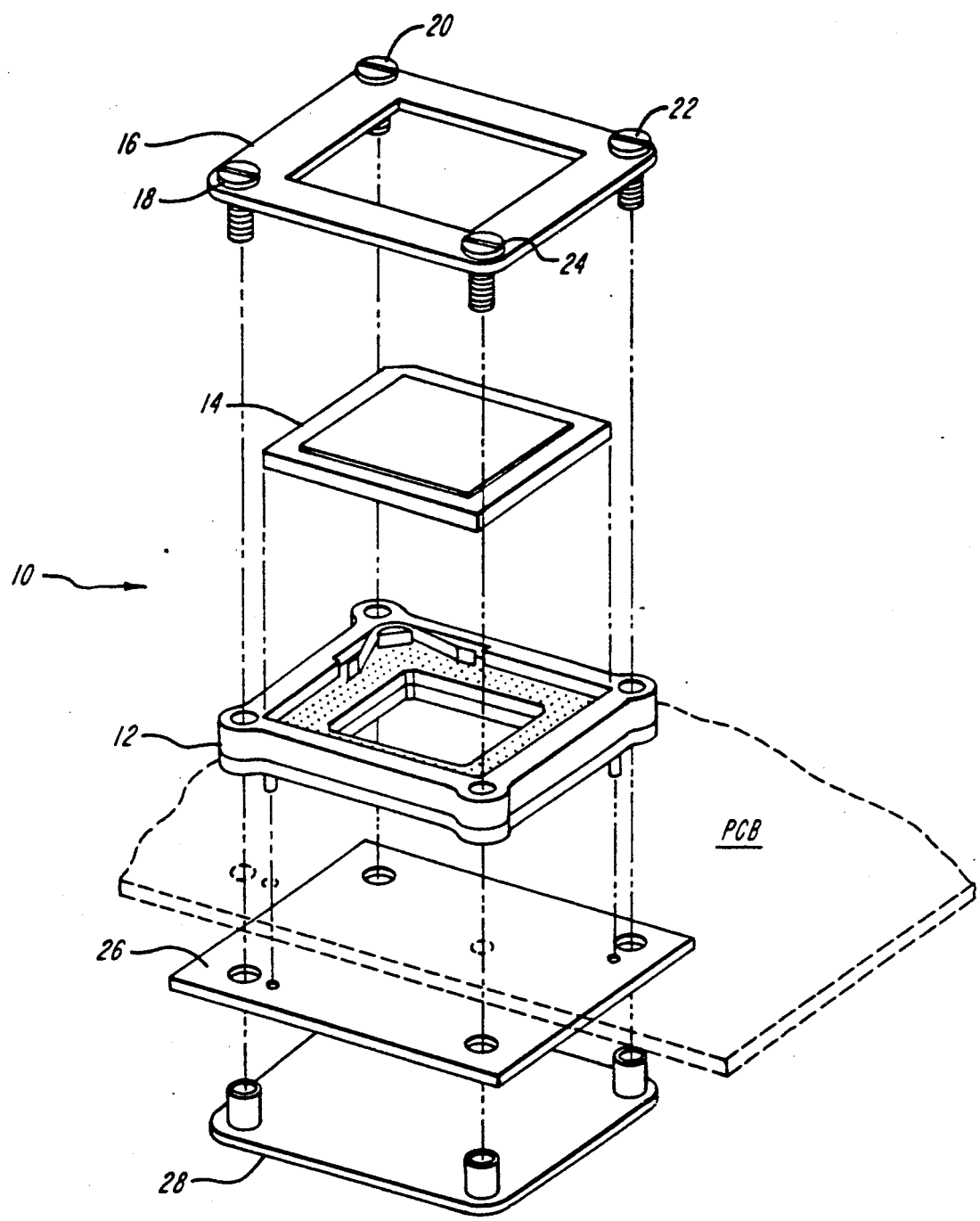
FIG. 1 is an exploded view of a leadless component contact socket according to the invention.

A leadless component contact socket 10, illustrated in FIG. 1, generally comprises a leadless component contact socket assembly 12 which accommodates a leadless chip carrier 14 having a flat corner 15 which is maintained in the contact socket assembly 12 by a cover 16. The cover 16 preferably includes captive hardware, in this case, four screws 18, 20, 22 and 24. Insulation material 26 is disposed proximate to a backup plate 28 or fastener.

Figure 2A:
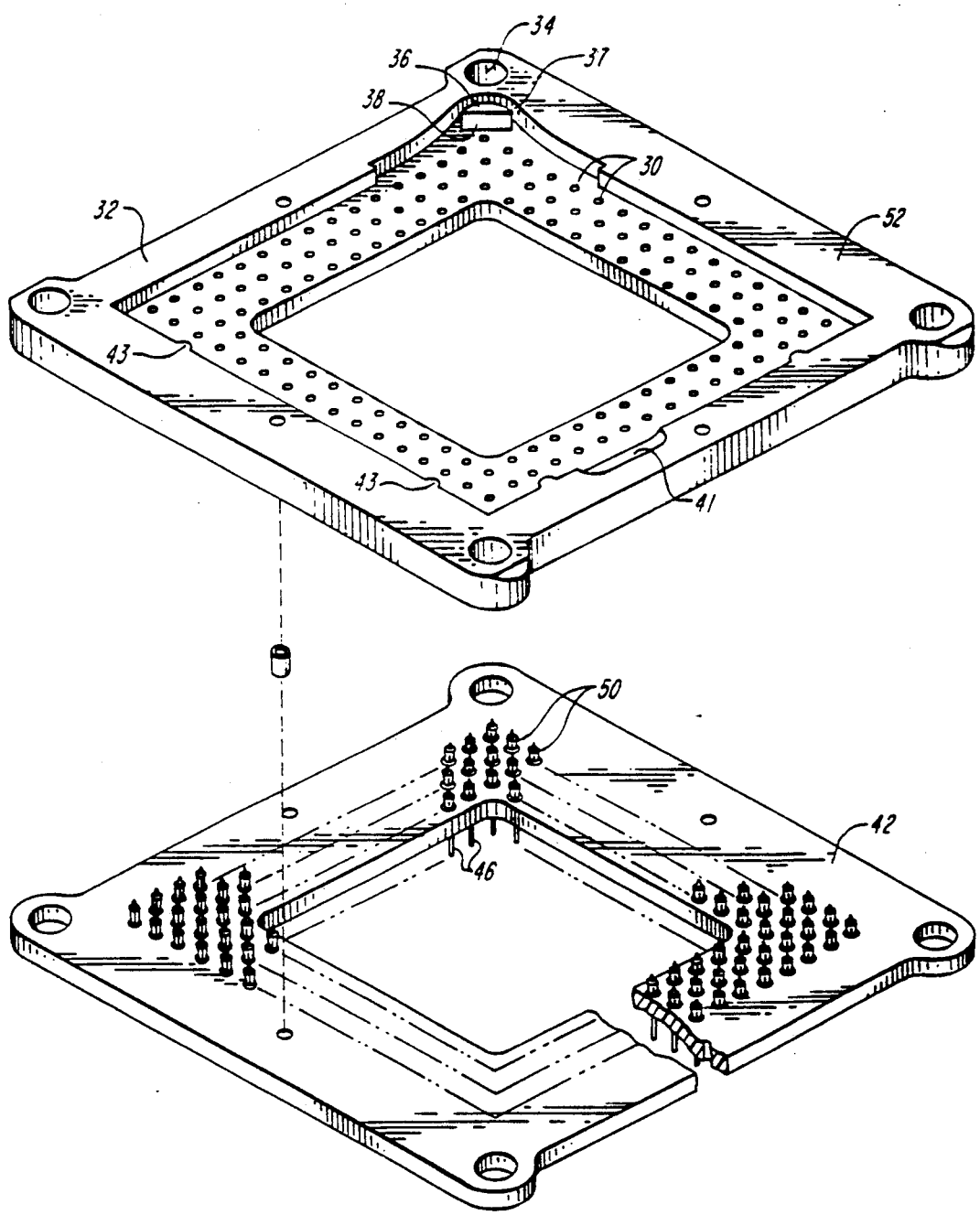
FIG. 2A is a perspective view of a leadless component contact socket assembly of the socket of FIG. 1.
Figure 2B:
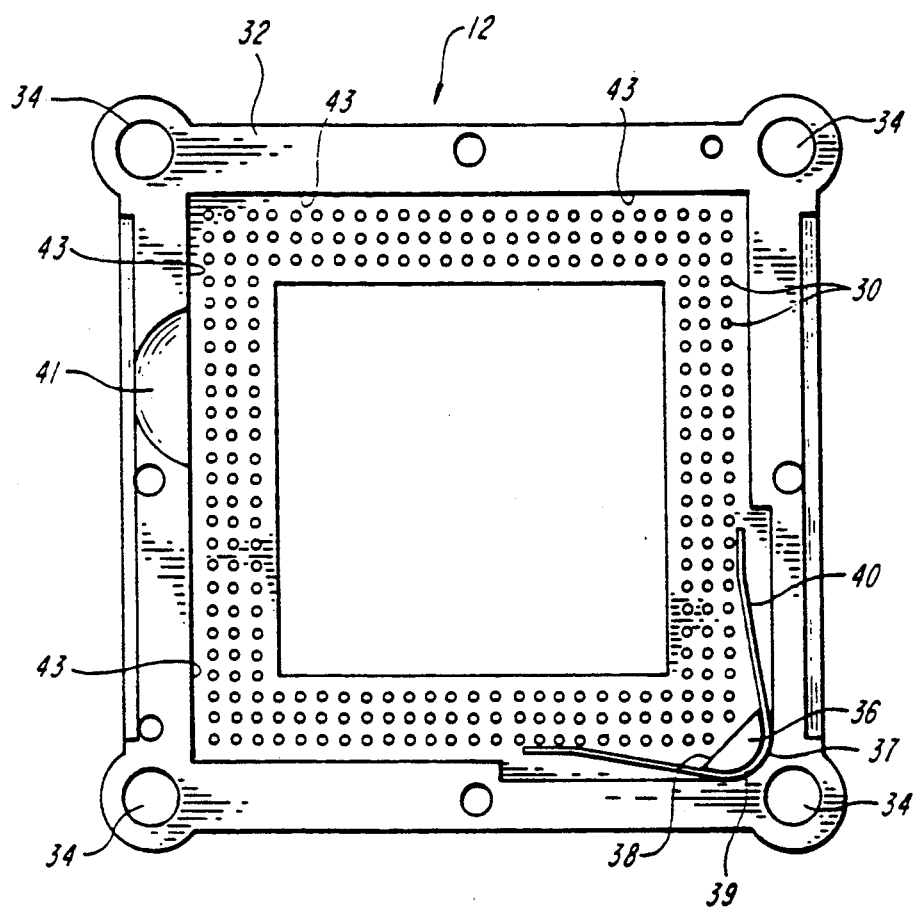
FIG. 2B is a top view of the leadless component contact socket assembly of FIG. 2A.
Figure 4A:
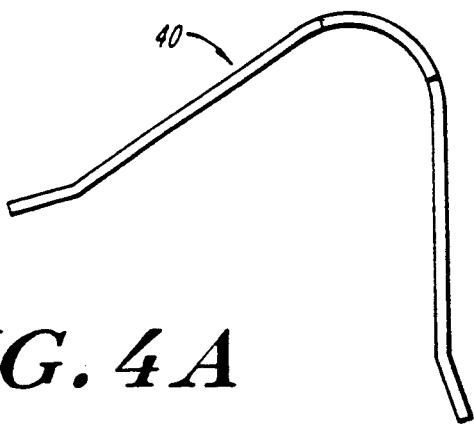
FIGS. 4A, 4B, and 4C are various views of a bias clip of the leadless component contact assembly of FIG. 2A.
Figure 4B:
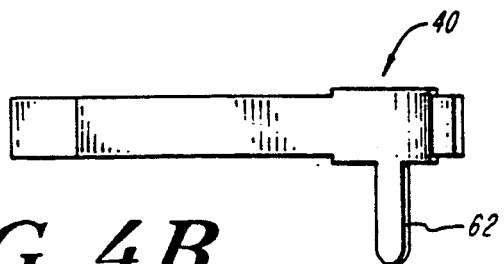
Figure 4C:
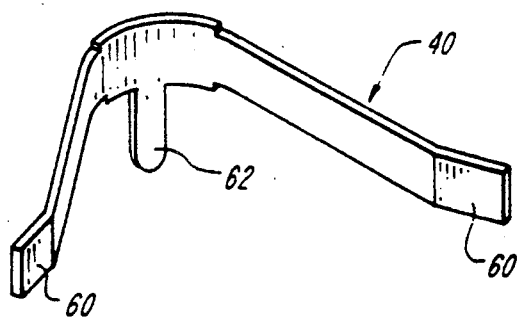

As illustrated in FIGS. 2A and 2B, the leadless component contact socket assembly 12 comprises an array of openings 30 that contain respective two-piece spring contacts, such as described in U S. Pat. No. 4,838,801 to Bertoglio et al, which is incorporated herein by reference. For integration into a leadless component socket according to the invention, the contact socket assembly 12 comprises a raised outer frame 32 which is substantially rectangular and has screw holes 34 disposed at each corner thereof. A keyed corner piece 36 is integral to the raised outer frame 32 and disposed in one corner as a substantially semicircular member separated from the raised frame 32 by a substantially semicircular channel 37. The top portion of the keyed corner 36 is substantially coplanar with the raised frame 32. An interior surface 38 of the corner 36 serves as an alignment surface for aligning a leadless chip carrier for proper disposition within the contact socket assembly 12. Frame 32 is further provided with a depression 39 about midpoint of the channel 37 located between the keyed corner piece 36 and a corresponding screw hole 34. The channel 37 and depression 39 accommodate a bias clip 40, such as is illustrated in FIGS. 4A-4C and discussed hereinafter. The raised frame 32 is also provided with at least one finger slot 41 which is a depression along an edge of raised frame 32 that permits access 14 to a side of a leadless chip carrier resident in the contact socket assembly, to facilitate fingertip removal of the chip carrier therefrom.

The contact socket assembly 12, as illustrated in FIGS. 2A, 2B and 3A-3C, comprises an insulative base 42 having an array of base openings 44 conforming to the terminal pattern of a leadless chip carrier to be retained in the socket. The base openings 44 accommodate a plunger base 46 which is maintained in the opening by a shoulder 48 that prevents passage of the plunger base 46 through the base opening 44. A contact tip 50 engages the plunger base 46 to effect a spring contact as described in detail in the referenced patent. A top insulative portion 52 having a corresponding array of top openings 54 is disposed on insulative base 42 to form the contact socket assembly 12. The top insulative portion 52 has a plurality of holes 56 integral with the top openings 54 through which the contact tips 50 protrude in the array conforming to the terminal pattern of the device to be retained in the socket.

A variety of contact terminal patterns can be configured in the contact socket assembly by including or excluding contact terminals from selected holes. Further, a variety of types of contact terminals can be configured for a variety of modes of interfacing the socket assembly 12 with a printed circuit board. Plunger bases 46 are illustrated for configuration with printed circuit boards in compression, surface mount and plated through-hole interface modes as in FIGS. 3A, 3B and 3C, respectively.

Figure 3A:
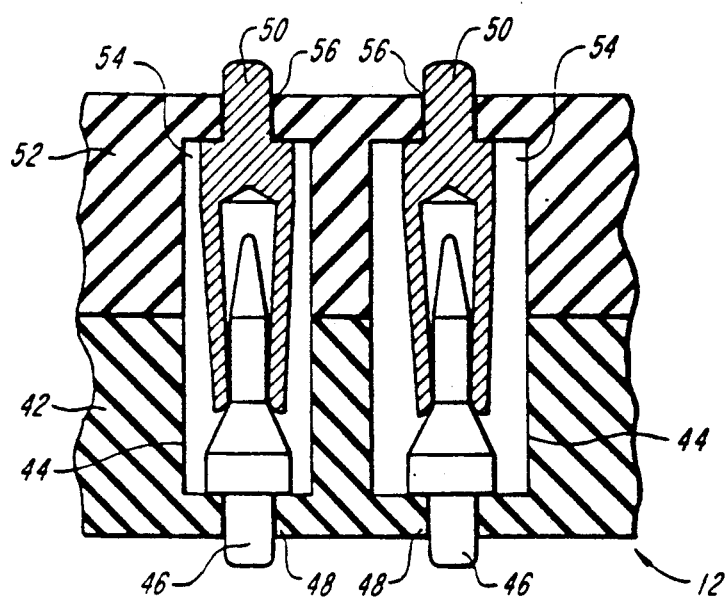
FIGS. 3A, 3B and 3C are side section views of the contact socket assembly of FIG. 2A having compression, surface mount, and through-hole mode terminals disposed therein, respectively.
Figure 3B:
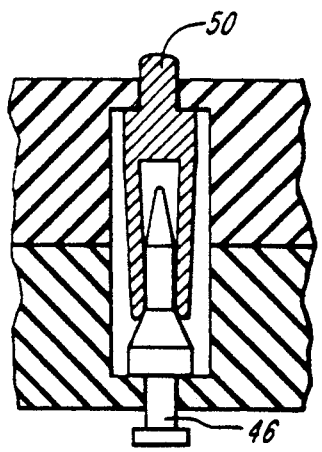
Figure 3C:
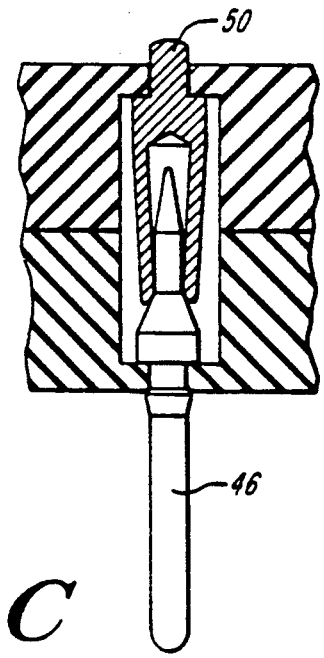
Figure 3D:
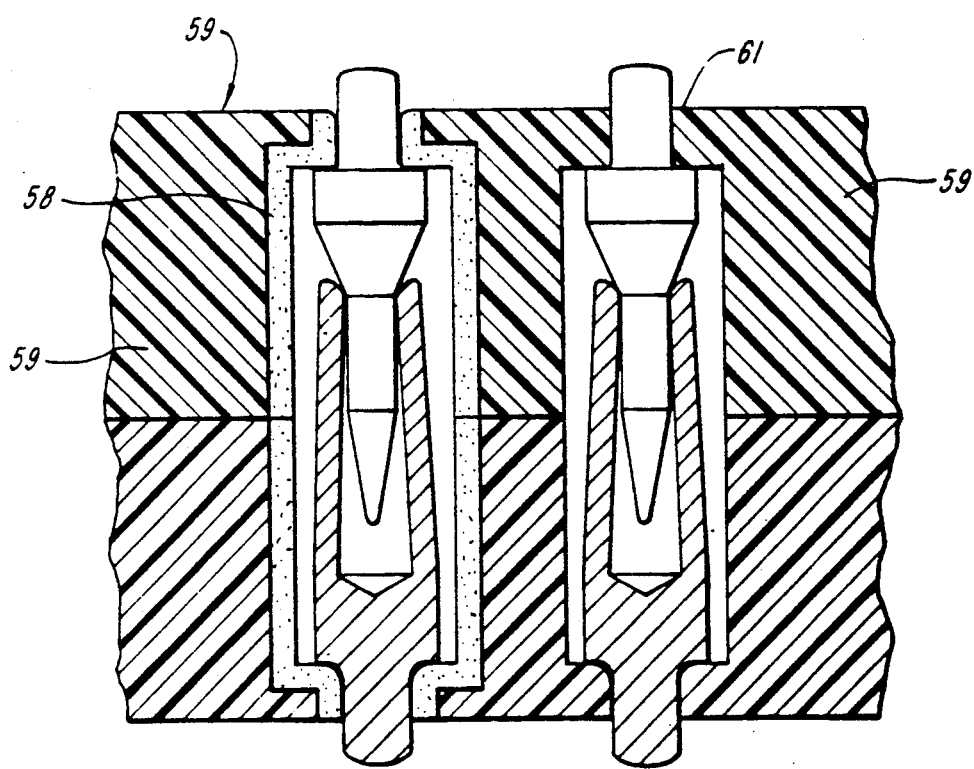
FIG. 3D is a side sectioned view of an embodiment having a dielectric cavity high speed transmission line environment.

Further, the contact socket assembly openings, as illustrated in FIG. 3D, can be provided in a conductive material 59 with a coaxial insulator 58, forming a dielectric cavity in which the contact tip 50 and selected plunger base 46 are enclosed. The dielectric on the interior of the base opening 44 and the top portion opening 54 can be formed of various insulative or dielectric materials or coatings such as poly tetrafluoroethylene, nylon, FR4 or the like. Signal integrity is enhanced by creating a transmission line environment for high speed, fast rise time signals. The thickness and/or composition of the dielectric in the cavity can be controlled to obtain desired impedance and/or crosstalk limiting characteristics. While a first contact terminal receptacle is configured with the dielectric cavity for high speed signal transmission, and adjacent cavity 61 is configured without the dielectric to act as a ground/return.

Figure 3E:
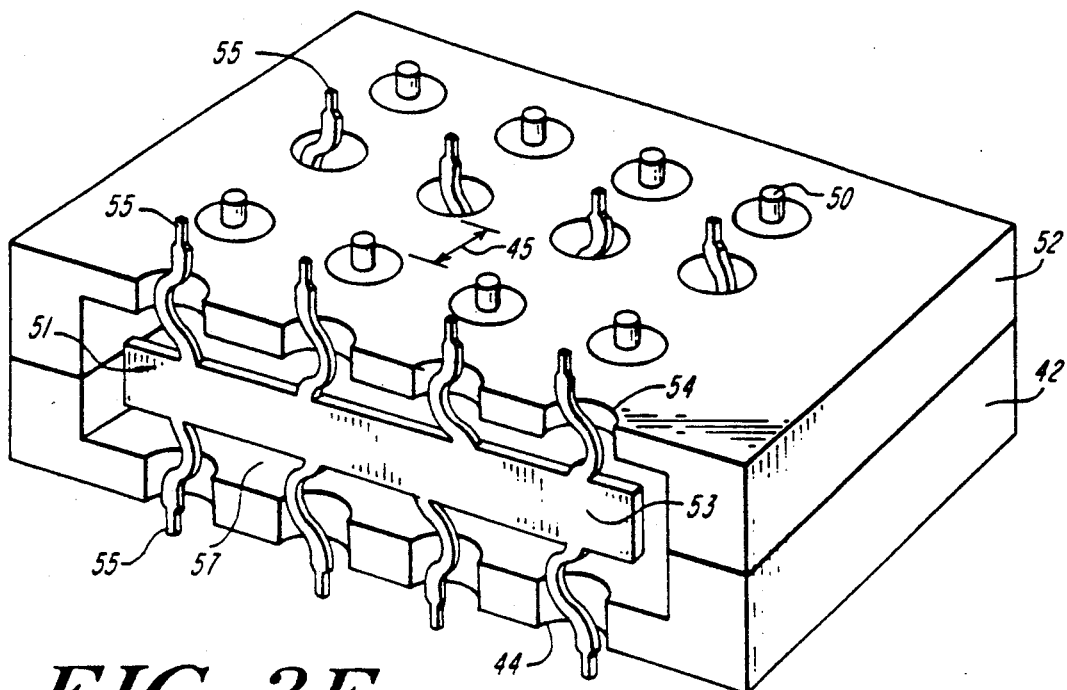
FIG. 3e is a side sectioned view of an embodiment having a high speed transmission line environment implemented using a compliant bus bar.

FIG. 3e illustrates an alternative transmission line environment implementing another signal integrity enhancement method that can be made to the interconnection socket applications described herein. This method employs a compliant ground/power bus bar approach. The compliant ground/power bus bar 51 approach will provide a transmission line environment in the interconnection application of high speed, fast rise time signals. This transmission line environment is created by placing a compliant ground/power bus bar in parallel with a row of signal carrying contact tips 50. The compliant bus bar 51 comprises a bus bar 53 having a plurality of compliant contacts 55. The bus bar 53 is disposed within a cavity 57 constructed in the insulative base 42 and the top insulative portion 52 so that compliant contacts 55 extend from the respective base opening 44 and top insulative portion opening 54. A space 45 between the compliant ground/power bus bar and the row of signal carrying contacts can be adjusted to obtain the desired impedance and/or cross talk limiting characteristics. This compliant ground/power bus bar provides a ground reference plane or a power plane that will carry current from the IC chip carrier/multi-chip module substrate to and from the printed circuit board.

Alignment of a leadless component carrier 14 within the contact socket assembly 12, and maintenance of compressive forces on the carrier 14 to ensure electrical interconnection between the carrier and the array of contact tips 50 is effected by a combination of the bias clip 40 and one of a variety of socket covers 16, according to the invention.

The bias clip 40, illustrated in FIGS. 4A-4C, comprises a resilient metal or plastic piece, molded or stamped substantially in a u-shape having two beams of equal length with slight bends at the ends thereof. The bends accommodate sides of the chip carrier package to substantially preclude lateral movement of the chip carrier in the contact socket assembly 12. A post 62 is disposed at about the mid-point of the substantially u-shaped clip 40. The post 62 is dimensioned for disposition within the depression 39 at the mid-point of the channel 37 of the top insulative portion of the contact socket assembly 12. The bias clip 40 is dimensioned to fit snugly within the channel 37 at the corner 36.

A variety of covers 16 are configurable with the leadless contact socket, to coact with the bias clip 40 and maintain the leadless chip carrier installed in the socket assembly 12 in good alignment using alignment bumps 43 with the array of contact pins 30 and with proper electrical interconnection therebetween. A flat cover 16, as illustrated in FIG. 1, has a plurality of captive screws 18, 20, 22, 24 aligned with the holes 34 of the contact socket assembly 12. The captive screws of the flat cover 16 mate with female receptacles integral with a backup plate 28 when the socket is attached to a printed circuit board as discussed hereinafter.

Figure 5A:
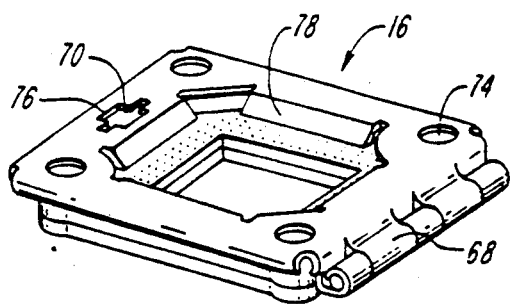
FIGS. 5A, 5B, 5C and 5D are various views of a hinged spring cover assembly adapted for use with the socket of FIG. 1.
Figure 5B:
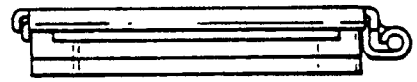
Figure 5C:
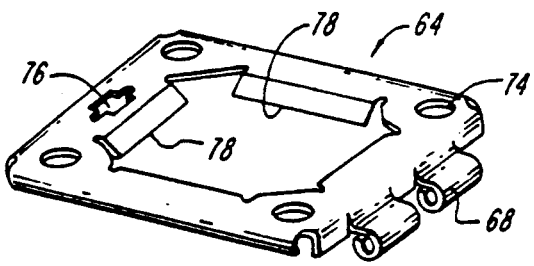
Figure 5D:
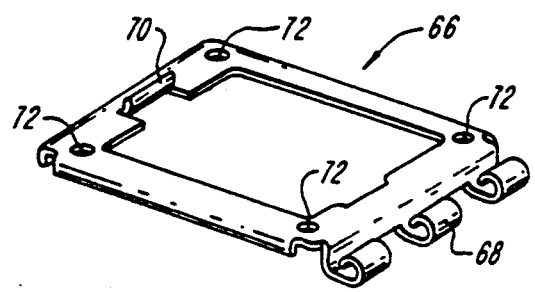

A hinged cover configuration is illustrated in FIGS. 5A-5D. In such a configuration, the cover 16 comprises a hinged spring cover 64 (FIG. 5C) and a mating hinged cover support 66 (FIG. 5D). Both cover 64 and support 66, in this exemplary embodiment, have a plurality of mateable hinge sleeves 68 through which a hinge pin is installed to mate the cover 64 and cover support 66, as illustrated in FIG. 5A. The cover support 66 has an integral latch 70 and four screw holes 72 which align with the screw holes 34 in the contact socket assembly 12. The hinged cover 64 has a matching set of screw holes 74 which are sized larger than the support screw holes 72 so that screws captive in the support 66, in a manner as known in the art, appear counter sunk in the assembled cover or flush therewith. The cover 64 has a latch slot 76 configured to mate with the latch 70 on the support 66 to maintain the assembled cover in a closed position. A plurality of cover beams 78, preferably one on each side of the cover 64 extend downwardly and are dimensioned to put sufficient force on a chip carrier aligned in the contact socket assembly 12 to keep the chip carrier in good alignment and to maintain proper electrical interconnection between the array of contact pins 50 and the leadless component carrier contacts.

An alternative hinged cover configuration, illustrated in FIGS. 6A-6E, has a plurality of hinge flaps 80 on an eared cover top 82 and a corresponding plurality of hinge slots 84 on an eared support or base 86 for receipt of the flaps 80. Opposing ears 88, 90 on the base 86 have screw holes therein which are aligned with holes on opposing ears 92, 94 on the cover top 82. The aligned screw holes on the ears facilitate closure and fastening of the top 82 to the base 86. Like the hinged embodiment disclosed in FIGS. 5A-5D and 6A-6D, the eared cover has a plurality of cover beams 94 on the top 82, for keeping an installed chip carrier in good alignment and proper electrical interconnection with the array of contact pins 50 of the contact socket assembly 12.

Figure 6A:
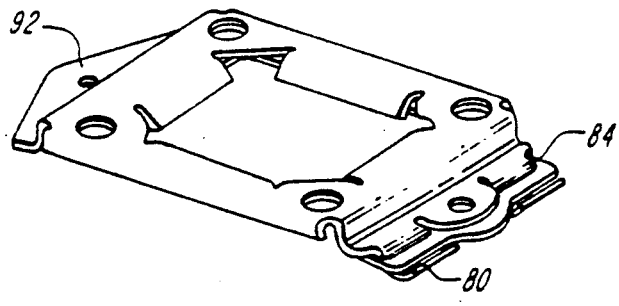
FIGS. 6A, 6B, 6C and 6D are various views of another embodiment of a hinged spring cover assembly.
Figure 6B:
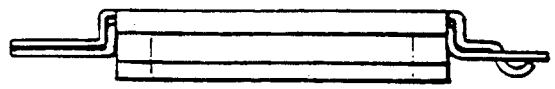
Figure 6C:
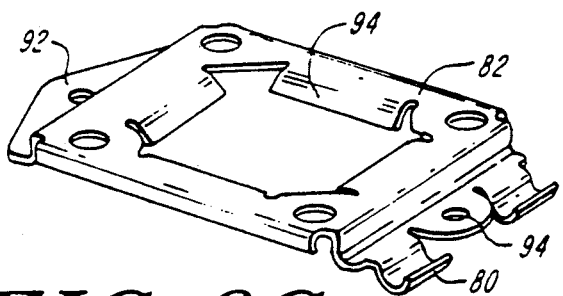
Figure 6D:
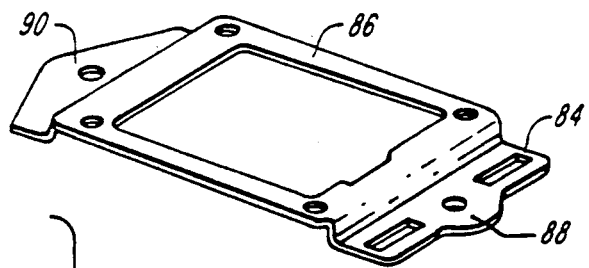
Figure 6E:
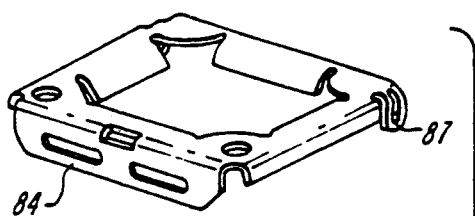
FIG. 6E is another hinged cover embodiment.
Figure 6E:
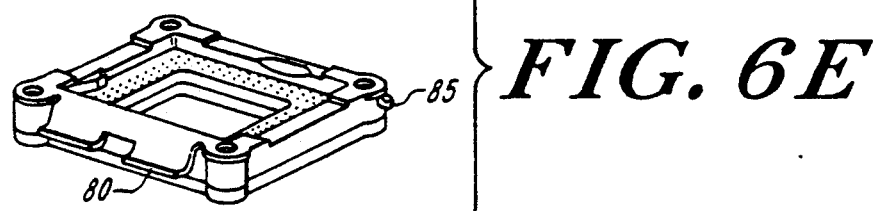

A non-eared hinged cover is illustrated in FIG. 6E, wherein hinge flaps 80 and hinge slots 84 are opposed by a protrusion 85 and hook lock 87, respectively, to maintain the cover in a closed position.

Figure 7:
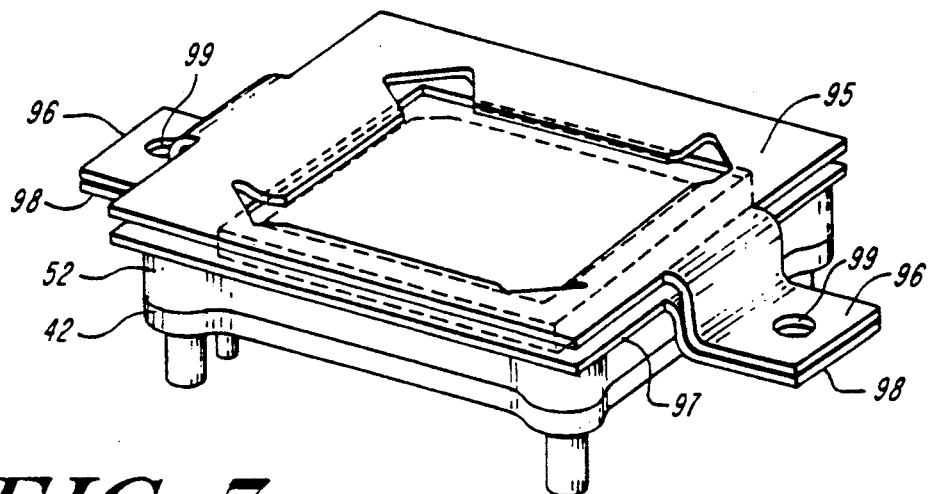
FIG. 7 is a perspective view of a spring cover with ears fastened to a spring cover support.
Figure 8:
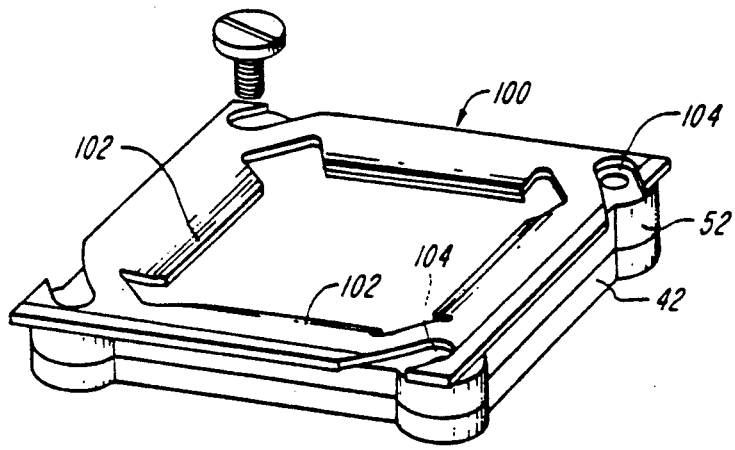
FIG. 8 is a perspective view of a rotating spring cover.

Still other embodiments of covers for the high density socket according to the invention, are illustrated in FIGS. 7 and 8. A non-hinged spring cover 95 with ears 96 fastened to a non-hinged cover support 97 with ears 98 is shown in FIG. 7. The cover is attached to the contact socket assembly 12 by screws holding down the cover support with ears. The screws protrude from the base of the contact socket assembly so that they can be fastened to a backup plate (not shown) through an insulation material. The ears on the cover have holes 99 through which removable fastening devices are employed to fasten the cover 96 to the cover support 98.

A rotatable spring cover 100, FIG. 8, is a one-piece cover providing spring beam compression and ease of installation. The single piece rotatable cover has four spring beams 102, like the other non-flat covers described hereinbefore, which extend downwardly for alignment and retention of an installed chip carrier. The cover has four corner cut-outs 104 that accommodate the shaft of a screw, which is captively installable in the contact socket assembly 12, so that the rotating cover 100 is attachable to the contact socket assembly 12 by rotating the cover so that the cut-outs 104 engage the screw shafts. The screws can then be tightened down to retain the cover in place.

Figure 9:
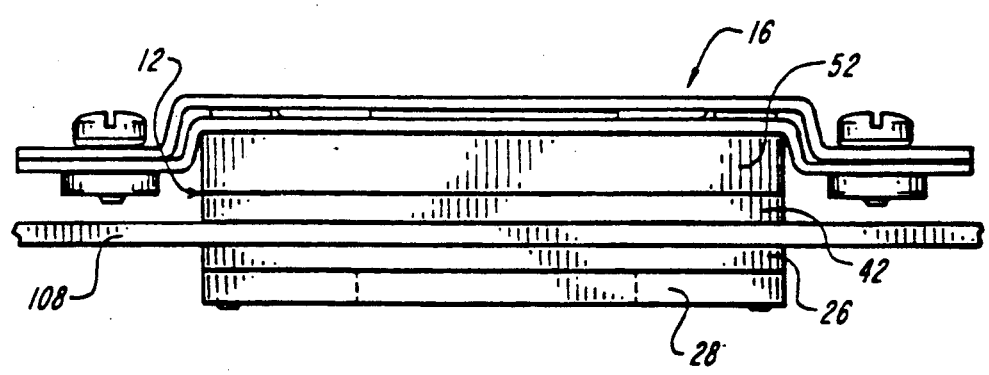
FIG. 9 is a side elevation view of the leadless component contact socket of FIG. 7 disposed on a printed circuit board.

Referring now to FIGS. 1 and 9, the high density contact socket according to the invention is implemented by installing a leadless chip carrier or multichip package 14 in the leadless component contact socket assembly 12, in alignment with the array of contact tips 50. Alignment is facilitated by the corner 36 and the bias clip 40. A selected cover and accompanying captive screws are aligned by directing the screws through the holes 34 in the contact socket assembly and through corresponding holes in a printed circuit board 108 onto which the socket is mounted. Preferably, the socket is aligned on the printed circuit board in alignment with mateable receptacles which accommodate either compression, through-hole or surface mount techniques, as known in the art.

Figure 8A:
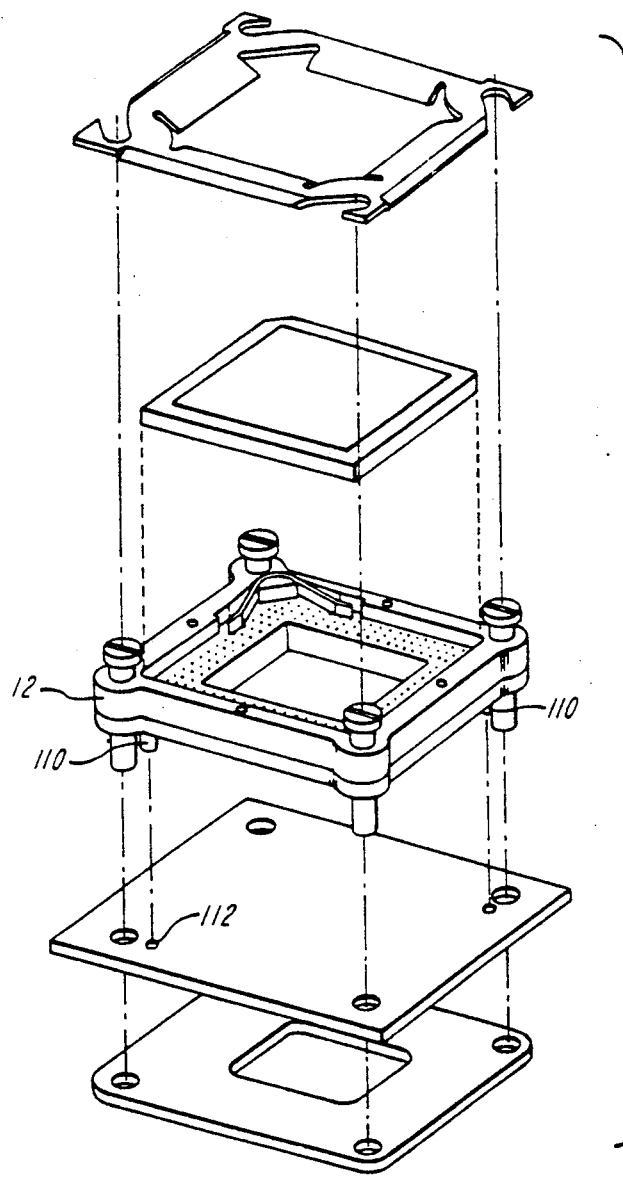
FIG. 8A is an exploded view of a contact socket having the rotating cover of FIG. 8.
Figure 8B:
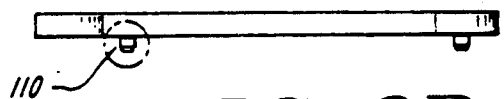
FIG. 8B is a side view of a portion of an insulative member having location on a bottom surface.
Figure 8C:
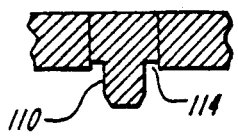
FIG. 8C is a side sectioned view of a location post and depression thereabout.

Location posts 110, as illustrated in FIGS. 8A-8C, are included on a bottom side of the insulative portion of the contact socket assembly. The location posts engage and align the socket with corresponding holes 112 in the printed circuit board on which the socket is mounted. Preferably, the posts 110 are dimensioned having a depressed radius 4 thereabout which is counter sunk below the bottom surface to minimize breakage of the posts. The depressed radius 114 also serves as a void in which particles of circuit board material or skived plastic may go during alignment and installation so that the socket sits flush on the circuit board having the proper electrical engagement therewith.

Insulation material 26 may be installed between the backup plate 28 and the printed circuit board 108 (the insulation material is attached to the backup plate using adhesive). The socket is fastened to the circuit board by fastening the screws captive in the selected cover, to the back-up plate 28 which has threaded holes to receive the captive screws.

Alternative hardware can be used to fasten the socket assembly to the printed circuit board and if an insulative material is used for the back-up plate, the insulation material 26 can be eliminated.

Although several embodiments of covers are disclosed herein, various other cover embodiments can be employed to suit specific operational requirements.

While the raised outer frame 32 and the keyed corner 36 are described as rectangular and semicircular, respectively, it can be appreciated that alternative geometries and dimensions can be implemented.

Although the socket is described as having a bias clip and keyed corner in the same corner for chip alignment, it can be appreciated that the clip could be in one corner while the key for chip polarization could be in a separate corner.

Although the invention has been shown and described with respect to an illustrative embodiment thereof, it should be understood by those skilled in the art that the foregoing and various other changes, omissions and additions in the form and detail thereof may be made without departing from the spirit and scope of the invention as delineated in the claims.

What is claimed is:

1. A high density contact socket comprising:
   a contact socket assembly having an insulative portion, said insulative portion having a plurality of holes disposed therein and having a channel disposed in at least one corner thereof;
   a plurality of resilient contacts disposed in at least some of said plurality of holes, aid plurality of resilient contacts comprising a separable contact tip and contact base;
   a biasing means for maintaining alignment of a plurality of electrical connections between a component installed in said contact socket assembly and said plurality of resilient contacts, said biasing means including at least one substantially U-shaped resilient biasing clip having a bight configured for disposition within said channel and a pair of beams extending therefrom that are disposed in a plane substantially parallel to a planar top surface of said component installed in said contact socket assembly, said pair of beams forming legs of said U-shaped clip and fee ends of said pair of beams located to resiliently engage said walls of said component installed in said contact socket assembly;
   an integral means for ensuring a particular orientation of said leadless component said integral means disposed proximate to said bight disposed in said channel between said integral means and said at least one corner of said insulative portions;
   a cover adapted to be disposed on said contact socket assembly and adapted for applying sufficient pressure on said component installed in said contact socket assembly to maintain said component in electrical engagement with said plurality of resilient contacts;
   a back-up fastener adapted for connection with at least one of said cover and said contact socket assembly; and engagement means for maintaining said contact socket assembly, said cover and said back-up plate in mutual engagement.

2. The high density contact socket of claim 1 further comprising an insulator material disposed between said back-up fastener and a printed circuit board on which said high density contact socket is mounted.

3. The high density contact socket of claim 1 wherein said engagement means comprises captive screws.

4. The high density contact socket of claim 1 wherein said contact socket assembly is adapted for receiving at least one leadless component package.

5. The high density contact socket of claim 1 wherein said contact base of said plurality of resilient contacts is adapted for surface mount interconnection with a printed circuit board.

6. The high density contact socket of claim 1 wherein said contact base of said plurality of resilient contacts is adapted for compression interconnection with at least one printed circuit board conductor.

7. The high density contact socket of claim 1 wherein said contact base of said plurality of resilient contacts is adapted for through-hole interconnection with at least one printed circuit board conductor.

8. The high density contact socket of claim 1 wherein at least some of said plurality of holes comprise a means for creating a high speed transmission line environment.

9. The high density contact socket of claim 1 wherein said biasing means comprises said substantially U-shaped resilient biasing clip working in conjunction with at least one alignment bump disposed on said insulative portion, to maintain said component installed in said contact socket assembly in good contact with said plurality of resilient contacts.

10. The high density contact socket of claim 1 wherein said integral means for ensuring a particular orientation comprises a keyed corner of said insulative portion of said contact socket assembly.

11. The high density contact socket of claim 1 wherein said cover comprises:
a single piece cover having a plurality of cut-out portions which rotatably engage said engagement means.

12. The high density contact socket of claim 1 wherein said cover comprises:
a first hinged portion and a second hinged portion, at least one of said first hinged portion and second hinged portion having means for applying sufficient pressure on a component installed in said socket to substantially ensure adequate electrical interconnection between said component and said plurality of resilient contacts.

13. The high density contact socket of claim 1 wherein, said insulative portion further comprises means for accessing and urging a component installed in said insulative portion therefrom.

14. The high density contact socket of claim 13 wherein said means for accessing and urging comprises a depression which facilitates access to a side of said component.

15. The high density contact socket of claim 11 further comprising means for applying sufficient pressure on a component installed in said socket to substantially ensure adequate electrical interconnection between said component and said plurality of resilient contacts.

16. The high density contact socket of claim 15 wherein said means for applying sufficient pressure comprises at least four downwardly extending beams integral with said single piece cover.

17. The high density contact socket of claim 12 wherein said means for applying sufficient pressure comprises at least four downwardly extending beams integral with at least one of said first hinged portion and said second hinged portion.

18. A high density contact socket comprising:
a contact socket assembly adapted for receiving at least one leadless component package and having an insulative portion, said insulative portion having a plurality of holes disposed therein and having a channel in at least one corner thereof adapted for receiving a biasing means for maintaining alignment of a leadless component installed in said contact socket assembly, said biasing means including a resilient substantially U-shaped biasing clip having a bight configured for disposition within said channel and a pair of beams extending therefrom which are disposed in a plane substantially parallel to a planar top surface of said leadless component said pair of beams forming legs of said U-shaped clip and free ends of said pair of beams located to resiliently engage side walls of said leadless component installed in said contact socket assembly;

an integral means for ensuring a particular orientation of said leadless component, said integral means for ensuring a particular orientation of said leadless component disposed proximate to said bight disposed in said channel between said integral means and said at least one corner of said insulative portion, said insulative portion having means for accessing and urging said leadless component therefrom;

a plurality of resilient contacts disposed in at least some of said plurality of holes, said plurality of resilient contacts comprising a contact tip and a contact base, said contact tip and said contact base partially protruding from said at least some of said plurality of holes in said insulative portion;

a cover adapted to be disposed on said contact socket assembly and adapted for applying sufficient pressure on a component installed in said contact socket assembly to maintain said component in electrical engagement with said plurality of resilient contacts;

a back-up plate adapted for connection with at least one of said cover and said contact socket assembly; and fastening means for configuring said contact socket assembly, said cover and said back-up plate in mutual engagement.

19. The high density contact socket of claim 18 further comprising a back-up plate insulator disposed between said back-up plate and a printed circuit board on which said high density contact socket is mounted.

20. The high density contact socket of claim 18 wherein said fastening means comprises captive screws.

21. The high density contact socket of claim 18 wherein said contact base of said plurality of resilient contacts is adapted for surface mount interconnection with a printed circuit board.

22. The high density contact socket of claim 18 wherein said contact base of said plurality of resilient contacts is adapted for compression interconnection with a printed circuit board.

23. The high density contact socket of claim 18 wherein said contact base of said plurality of resilient contacts is adapted for through-hole interconnection with a printed circuit board.

24. The high density contact socket of claim 18 wherein at least some of said plurality of holes are lined with a dielectric material that is surrounded by a conductive material and adapted for receipt of contact means for high speed signal transmission.

25. The high density contact socket of claim 18 wherein said biasing means comprises said resilient substantially U-shaped biasing clip working in conjunction with at least one alignment bump disposed on aid insulative portion, to maintain said component installed in said contact socket assembly in good contact with said plurality of resilient contacts.

26. The high density contact socket of claim 18 wherein said integral means for ensuring a particular orientation comprises a keyed corner of said first insulative portion of said contact socket assembly.

27. The high density contact socket of claim 18 wherein said cover comprises:

a single piece cover having a plurality of cut-out portions which rotatably engage said fastening means.

28. The high density contact socket of claim 18 wherein said cover comprises:

a first hinged portion and a second hinged portion, at least one of said first hinged portion and said second hinged portion having means for applying sufficient pressure on a component installed in said socket to substantially ensure adequate electrical interconnection between said component and said plurality of resilient contacts.

29. The high density contact socket of claim 18 wherein said means for accessing and urging comprises a depression which facilitates access to a side of said component.

30. The high density contact socket of claim 27 further comprising means for applying sufficient pressure on a component installed in said socket to substantially ensure adequate electrical interconnection between said component and said plurality of resilient contacts.

31. The high density contact socket of claim 32 wherein said means for applying sufficient pressure comprises at least one downwardly extending beam integral with said single piece cover.

32. The high density contact socket of claim 28 wherein said means for applying sufficient pressure comprises at least one downwardly extending beam integral with at least one of said first hinged portion and said second hinged portion.

33. The high density contact socket of claim 1 wherein said insulative portion comprises a first insulative portion and a second insulative portion.

34. The high density contact socket of claim 1 wherein said biasing means is a molded biasing clip.

35. The high density contact socket of claim 18 wherein said insulative portion includes a first insulative portion and a second insulative portion.

36. The high density contact socket of claim 8 wherein said means for creating a high speed transmission line environment comprises said plurality of holes being lined with a dielectric material that is surrounded by a conductive material and adapted for receipt of contact means for high speed signal transmission.

37. The high density contact socket of claim 8 wherein said means for creating a high speed transmission line environment comprises a compliant bus bar having a plurality of compliant bus contact disposed within some of said at least some of said plurality of holes and a plurality of signal contacts disposed within others of said at least some of said plurality of holes at a selected distance from said compliant bus contacts.

38. The high density contact socket of claim 24 wherein the thickness of said dielectric material is selectable to obtain a desired impedance characteristic.

39. The high density contact socket of claim 24 wherein the thickness of said dielectric material is selectable to obtain a desired crosstalk limiting characteristic.

40. The high density contact socket of claim 24 wherein said dielectric material is selected from a group consisting of PTFE, nylon and FR4.

41. The high density contact socket of claim 1 wherein said insulative portion comprises a location post on a bottom surface for alignment of said socket on a printed circuit board.

42. The high density contact socket of claim 41 wherein said location post has a depressed portion disposed thereabout.

43. The high density contact socket of claim 18 wherein said insulative portion comprises a location post on a bottom surface for alignment of said socket on a printed circuit board.

44. The high density contact socket of claim 43 wherein said location post has a depressed portion disposed thereabout.

* * * * *

UNITED STATES PATENT AND TRADEMARK OFFICE
CERTIFICATE OF CORRECTION

PATENT NO. : 5,215,472
DATED : June 1, 1993
INVENTOR(S) : Stephen D. DelPrete et al It is certified that error appears in the above-indentified patent and that said Letters Patent is hereby corrected as shown below:

Column 1, line 45, "The socket 10 generally" should read --The socket generally--.

Column 3, line 5, "permits access 14" should read --permits access--.

Column 5, line 62, "depressed radius 4" should read --depressed radius 114--.

Column 9, line 44, "claim 32" should read --claim 30--.

Column 9, line 13, "on aid insulative" should read --on said insulative--.

Signed and Sealed this

Eleventh Day of October, 1994

Attest:

BRUCE LEHMAN

Attesting Officer     Commissioner of Patents and Trademarks